United States Patent
Noh et al.

(10) Patent No.: US 10,607,853 B2
(45) Date of Patent: Mar. 31, 2020

(54) CMP SLURRY COMPOSITION FOR POLISHING COPPER LINE AND POLISHING METHOD USING SAME

(71) Applicant: SAMSUNG SDI CO., LTD., Yongin-si, Gyeonggi-do (KR)

(72) Inventors: Jong Il Noh, Uiwang-si (KR); Dong Hun Kang, Uiwang-si (KR); Jeong Hwan Jeong, Uiwang-si (KR); Young Nam Choi, Uiwang-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/528,972

(22) PCT Filed: Oct. 12, 2015

(86) PCT No.: PCT/KR2015/010731
§ 371 (c)(1),
(2) Date: May 23, 2017

(87) PCT Pub. No.: WO2016/171350
PCT Pub. Date: Oct. 27, 2016

(65) Prior Publication Data
US 2017/0271172 A1    Sep. 21, 2017

(30) Foreign Application Priority Data

Apr. 24, 2015    (KR) .......................... 10-2015-0058070

(51) Int. Cl.
```
H01L 21/321      (2006.01)
C09K 3/14        (2006.01)
H01L 21/304      (2006.01)
C09G 1/04        (2006.01)
C09G 1/02        (2006.01)
H01L 21/306      (2006.01)
```
(52) U.S. Cl.
CPC ............ H01L 21/3212 (2013.01); C09G 1/02 (2013.01); C09G 1/04 (2013.01); C09K 3/1409 (2013.01); C09K 3/1463 (2013.01); H01L 21/304 (2013.01); H01L 21/30625 (2013.01)

(58) Field of Classification Search
CPC ............... H01L 21/3212; H01L 21/304; H01L 21/30625; C09G 1/04; C09G 1/02; C09K 3/14
See application file for complete search history.

(56) References Cited

U.S. PATENT DOCUMENTS

```
8,137,580 B2      3/2012   Shin et al.
2006/0124593 A1*  6/2006   Moyaerts ................. C09G 1/02
                                                            216/88
2008/0237535 A1  10/2008   Maejima et al.
2008/0311750 A1* 12/2008   Izumi .................... B24B 37/044
                                                            438/693
2016/0177155 A1*  6/2016   Nakamura .............. B24B 37/00
                                                            252/79.1
2017/0178926 A1*  6/2017   Matsushita ......... H01L 21/3212
```

FOREIGN PATENT DOCUMENTS

```
KR    10-2000-0047799 A      7/2000
KR    10-2012-0069785 A      6/2012
KR    10-2012-0117513 A     10/2012
TW          200904956 A      2/2009
WO       WO 2015/012118 A1   1/2015
```

OTHER PUBLICATIONS

J. J. Kim et al, KR 10-2012-0117513 A, Oct. 24, 2012, English machine translation. (Year: 2012).*
ASTM Standard D5127-13; "Standard Guide for Ultra-Pure Water Used in the Electronics and Semiconductor Industries", ASTM (Jan. 1, 2013), https://compass.astm.org/EDIT/html_print_full.cgi?D5127. (Year: 2013).*
Korean Office Action dated Oct. 10, 2017 in the corresponding Korean Patent Application No. 10-2015-0058070.
Chinese Office Action dated Jun. 4, 2018 in the corresponding Chinese Patent Application No. 2015800730469.

* cited by examiner

*Primary Examiner* — Anita K Alanko
(74) *Attorney, Agent, or Firm* — Lee IP Law, PC

(57) ABSTRACT

The present invention relates to a CMP slurry composition for polishing a copper line, the CMP slurry composition comprising a colloidal silica, an oxidizing agent, a complexing agent, a corrosion inhibitor, a pH regulator, and ultrapure water. The colloidal silica has a specific surface area (BET) of 72.9 to 88.5 m$^2$/g, and 0.1 to 2 wt % of the colloidal silica is included in the CMP slurry composition. The CMP slurry composition has an excellent copper line polishing rate, has a low number of defects and minimizes scratches after polishing, and can minimize dishing.

9 Claims, No Drawings

CMP SLURRY COMPOSITION FOR POLISHING COPPER LINE AND POLISHING METHOD USING SAME

CROSS REFERENCE TO RELATED APPLICATIONS

This is the U.S. national phase application based on PCT Application No. PCT/KR2015/010731, filed Oct. 12, 2015, which is based on Korean Patent Application No. 10-2015-0058070, filed Apr. 24, 2015, the entire contents of all of which are hereby incorporated by reference.

TECHNICAL FIELD

The present invention relates to a CMP slurry composition for polishing copper interconnects and a polishing method using the same.

BACKGROUND ART

In semiconductor fabrication, a CMP process refers to a process of planarizing a surface of a semiconductor wafer by applying a polishing agent-containing slurry thereto, followed by performing an orbital movement, in which rotational and linear movements are combined, under conditions that a polishing pad contacts the wafer surface.

Components of slurries used in the CMP process are mainly divided into polishing particles, which performs physical action, and a compound such as an etchant, which performs chemical action. Thus, a CMP slurry selectively etches an exposed portion of a wafer surface through physical action and chemical action, thereby allowing optimum and wide planarization to be accomplished.

Generally, in a semiconductor process, the CMP process is widely used as a process of forming metal interconnects and plugs or vias of a highly integrated circuit. In such a process, first, a low dielectric film, such as SOG, BPSG, O3-TEOS, USG, P-TEOS, FOX, or the like, is deposited on a wafer or a metal layer and a trench is formed in the low dielectric film through photolithography and dry etching. Next, in order to improve adhesion between the metal layer and the low dielectric film, a barrier layer is deposited using titanium, titanium nitride, tantalum, tantalum nitride, and the like. Next, a conductive material such as tungsten, aluminum, copper, or the like is deposited thereon by filling a pattern for metal interconnects or plugs therewith. Finally, the metal layer is completely removed from the low dielectric film by a CMP process using slurries for metal polishing, thereby forming metal interconnects, plugs, vias, and the like.

Since copper has various advantages in terms of efficiency in high integration and the like, copper is frequently used as a metallic material on a semiconductor wafer and forms a porous oxide layer composed of CuO, $CuO_2$, $Cu(OH)_2$ and the like, which are oxides of Cu and $Cu^{2+}$, upon a CMP process. However, since copper is more vulnerable than a silicon material such as tetraethoxysilane (TEOS) or other materials such as tungsten despite a good polishing rate, copper is likely to suffer from scratching, and particularly, can cause a problem upon photolithography subsequent to a polishing process due to a phenomenon in which foreign substances such as components of a polishing slurry, oxide generated during the polishing process, and the like penetrate into a copper oxide layer through holes of the porous film.

In order to solve such problems, one or more complexing agents or chelating agents are generally added to a CMP slurry for polishing copper interconnects so as to allow chelation or complexation of $Cu^+$ and $Cu^{2+}$ ions in a copper oxide layer such that the copper oxide layer can be reinforced through removal of holes due to porosity of the film, thereby preventing problems due to penetration of foreign substances during a CMP process. Examples of such additives include imidazole compounds, such as triazole, benzotriazole and the like, and carboxyl group-containing compounds.

However, the polishing rate in the CMP process is deteriorated due to reinforcement of the copper oxide layer, and as a result, there occur problems such as erosion, dishing and the like due to over-polishing caused by increased polishing time. This cause an increase in fabrication costs due to deterioration in yield and productivity upon semiconductor fabrication.

DISCLOSURE

Technical Problem

It is one aspect of the present invention to provide a CMP slurry composition having a high polishing rate with respect to copper interconnects.

It is another aspect of the present invention to provide a CMP slurry composition capable of providing less polishing defect and minimizing scratching.

It is a further aspect of the present invention to provide a CMP slurry composition minimizing dishing.

Technical Solution

In accordance with one aspect of the present invention, a CMP slurry composition for polishing copper interconnects includes colloidal silica, an oxidant, a complexing agent, a corrosion inhibitor, a pH regulator, and ultrapure water, wherein the colloidal silica has a specific surface area (BET) of 72.9 $m^2/g$ to 88.5 $m^2/g$ and is present in an amount of 0.1% by weight (wt %) to 2 wt %.

The CMP slurry composition may include 0.1 wt % to 2 wt % of the colloidal silica, 0.1 wt % to 30 wt % of the oxidant, 0.01 wt % to 5 wt % of the complexing agent, 0.005 wt % to 5 wt % of the corrosion inhibitor, 0.001 wt % to 5 wt % of the pH regulator, and the balance of ultrapure water.

The colloidal silica may include at least one of first colloidal silica having a specific surface area of 81.2 $m^2/g$ to 83.2 $m^2/g$ and second colloidal silica having a specific surface area of 78.9 $m^2/g$ to 80.9 $m^2/g$.

The first colloidal silica and the second colloidal silica may include at least one of spherical type colloidal silica and cocoon type colloidal silica.

The first colloidal silica may be spherical type colloidal silica, and the second colloidal silica may be cocoon type colloidal silica.

The first colloidal silica and the second colloidal silica may be present in a weight ratio of 1:0.42 to 1:2.34.

The spherical type colloidal silica may have an average particle diameter (D50) of 25 nm to 35 nm.

The cocoon type colloidal silica may have a major diameter 50 nm to 55 nm and a minor diameter of 25 nm to 30 nm.

The oxidant may include at least one selected from the group consisting of inorganic and organic per-compounds, bromic acid, bromates, nitric acid, nitrates, chloric acid, chlorates, chromic acid, chromates, iodic acid, iodates, iron, iron salts, copper, copper salts, rare-earth metal oxides, transition metal oxides, potassium ferricyanide, and potassium dichromate.

The complexing agent may include at least one selected from the group consisting of carbonyl compounds, salts of carbonyl compounds, carboxylic acid compounds, salts of carboxylic acid compounds, alcohols, and amine-containing compounds.

The corrosion inhibitor may include at least one selected from the group consisting of benzotriazole, methylbenzotriazole, 1,2,3-triazole, triazole derivatives, benzotriazole derivatives, and methylbenzotriazole derivatives.

The CMP slurry composition may have a pH of 6 to 8.

In accordance with another aspect of the present invention, a polishing method includes polishing a copper interconnect using the CMP slurry composition as set forth above.

Advantageous Effects

According to the present invention, the CMP slurry composition can have a high polishing rate with respect to copper interconnects, provide less polishing defect, and minimize scratching and dishing.

BEST MODE

The present invention relates to a CMP slurry composition for polishing copper interconnects, including ultrapure water, (A) colloidal silica, (B) an oxidant, (C) a complexing agent, (D) a corrosion inhibitor, and (E) a pH regulator.

Hereinafter, each of the components of the CMP slurry composition will be described in detail.

(A) Colloidal Silica

The CMP slurry composition according to the present invention may include the colloidal silica having a certain specific surface area.

In one embodiment, the colloidal silica has a specific surface area (BET) of 72.9 m$^2$/g to 88.5 m$^2$/g, preferably 72.9 m$^2$/g to 86.5 m$^2$/g. Within this range, the CMP slurry composition can have a high polishing rate with respect to copper interconnects, provide less polishing defect, and minimize scratching and dishing. In one embodiment, the colloidal silica may include at least one of first colloidal silica having a specific surface area of 81.2 m$^2$/g to 83.2 m$^2$/g and second colloidal silica having a specific surface area of 78.9 m$^2$/g to 80.9 m$^2$/g.

In one embodiment, the first and second colloidal silica may include at least one of spherical type colloidal silica and cocoon type colloidal silica. Preferably, the first colloidal silica is spherical type colloidal silica and the second colloidal silica is cocoon type colloidal silica. As such, when the first colloidal silica of the spherical type and the second colloidal silica of the cocoon type are mixed, the CMP slurry composition can significantly reduce scratching and have excellent properties in terms of polishing rate and dishing.

In one embodiment, the first colloidal silica and the second colloidal silica may be present in a weight ratio of 1:0.42 to 1:2.34. Within this range, the CMP slurry composition can reduce scratching and dishing while realizing relatively good polishing rate.

In one embodiment, the spherical type colloidal silica has an average particle diameter (D50) of 25 nm to 35 nm, preferably 30 nm to 35 nm. Within this range, the CMP slurry composition can realize relatively good polishing rate while effectively suppressing scratching and dishing. In one embodiment, the cocoon type colloidal silica may have a major diameter of 50 nm to 55 nm and a minor diameter of 25 nm to 30 nm. Within this range, the CMP slurry composition can realize relatively good polishing rate while effectively suppressing scratching and dishing.

In one embodiment, the colloidal silica may be high-purity colloidal silica. The high-purity colloidal silica may have excellent properties in terms of storage stability and scratching. The colloidal silica may include 20 ppm or less of metal impurities.

The colloidal silica may be present in an amount of 0.1 wt % to 2 wt %, preferably 0.1 wt % to 1 wt %, in the CMP slurry composition. If the amount of the colloidal silica is out of this range, the CMP slurry composition can suffer from reduction in polishing rate and deterioration in storage stability.

(B) Oxidant

The oxidant may be an appropriate oxidant known in the art. The oxidant may include at least one selected from the group consisting of inorganic and organic per-compounds, bromic acid and salts thereof, nitric acid and salts thereof, chloric acid and salts thereof chromic acid and salts thereof, iodic acid and salts thereof, iron and salts thereof, copper and salts thereof, rare-earth metal oxides, transition metal oxides, potassium ferricyanide, and potassium dichromate.

The per-compounds (as defined in Hawley's Condensed Chemical Dictionary) are compounds including one or more peroxy groups (—O—O—) or including an element in the highest oxidation state. Examples of the compounds including one or more peroxy groups may include hydrogen peroxide, hydrogen peroxide adducts such as urea hydrogen peroxide and percarbonate, organic peroxides such as benzoyl peroxide, peracetic acid and di-tert-butyl peroxide, peroxymonosulfuric acid and salts thereof ($SO_5^{2-}$), peroxydisulfuric acid and salts thereof ($S_2O_8^{2-}$), and sodium peroxide, without being limited thereto. Examples of the compounds including an element in the highest oxidation state may include periodic acid and salts thereof, perbromic acid and salts thereof, perchloric acid and salts thereof, perboric acid and salts thereof, and permanganic acid and salts thereof, without being limited thereto. Preferably, the oxidant includes hydrogen peroxide, peroxydisulfuric acid and salts thereof, and iodic acid and salts thereof.

The oxidant may be present in an amount of 0.1 wt % to 30 wt %, preferably 0.1 wt % to 20 wt %, more preferably 0.5 wt % to 15 wt %, in the CMP slurry composition.

The oxidant may be mixed with a CMP slurry precursor composition including no oxidant immediately before polishing.

(C) Complexing Agent

Optionally, the slurry composition may further include a chelating agent or a complexing agent. The complexing agent may be any chemical additive improving a removal rate of a substrate layer.

The complexing agent may include at least one selected from the group consisting of carbonyl compounds and salts thereof, carboxylic acid compounds and salts thereof, alcohols, and amine-containing compounds.

Specifically, the complexing agent includes carbonyl compounds (for example, acetlyacetonates and the like), simple carboxylic acids and salts thereof (for example, acetic acid and salts thereof, aryl carboxylic acids and salts thereof, and the like), carboxylic acids including one or more hydroxyl groups and salts thereof (for example, glycolic acid and salts thereof, lactic acid and salts thereof, gluconic acid and salts thereof, gallic acid and salts thereof, and the like), di-, tri-, and poly-carboxylic acids and salts thereof (for example, oxalic acid and salts thereof, phthalic acid and salts thereof, citric acid and salts thereof, succinic acid and salts thereof, tartaric acid and salts thereof, malic acid and salts thereof, EDTA and salts thereof (for example, dipotassium EDTA), mixtures thereof, and the like), carboxylic acids including one or more sulfonic acid and/or phosphonic acid groups and salts thereof, and the like. A suitable chelating agent or complexing agent may include, for example, di-, tri-, and polyalcohols (for example, ethylene glycol, pyrocatechol, pyrogallol, tannic acid, and the like) and amine-containing compounds (for example, ammonia, amino acids such as glycine and the like, amino alcohols, di-, tri-, and polyamines, and the like). The chelating agent or the complexing agent is determined depending upon types of substrate layers to be removed.

The compounds set forth above may be present in the form of a salt (for example, metal salts, ammonium salts), an acid, or a partial salt. For example, citric acid and salts thereof include citric acid and mono-, di-, and tri-salts thereof, phthalic acid and salts thereof include phthalic acid, mono-salts thereof (for example, potassium hydrogen phthalate), and di-salts thereof, and perchloric acid and salts thereof include the corresponding acid (that is, perchloric acid) and salts thereof. In addition, a certain compound or reactant can provide one or more functions. For example, certain compounds can act as a chelating agent and an oxidant (for example, iron nitrate and the like).

The complexing agent may be present in an amount of 0.01 wt % to 5 wt %, preferably 0.05 wt % to 2 wt %, more preferably 0.1 wt % to 1 wt %, in the CMP slurry composition.

(D) Corrosion Inhibitor

The corrosion inhibitor is a material retarding chemical reaction of an oxidant and serves as a polishing regulator enabling polishing by suppressing corrosion of a low step height area, in which physical polishing does not occur, and while allowing a high step height area, in which polishing occurs, to be removed due to physical action of a polishing agent. A nitrogen-containing compound is mainly used as the corrosion inhibitor, and may include, for example, ammonia, alkylamines, amino acids, imines, azoles, and the like. These corrosion inhibitors may be used alone or in combination thereof. Preferably, the corrosion inhibitor includes compounds including cyclic nitrogen compounds and derivatives thereof, more preferably compounds including benzotriazole and derivatives thereof, still more preferably at least one selected from the group consisting of benzotriazole, methylbenzotriazole, 1,2,3-triazole, triazole derivatives, benzotriazole derivatives, and methylbenzotriazole derivatives.

The corrosion inhibitor may be present in an amount of 0.005 wt % to 5 wt %, preferably 0.005 wt % to 1 wt %, more preferably 0.01 wt % to 0.5 wt %, in the CMP slurry composition in terms of corrosion suppressing effects, a suitable polishing rate, and prevention of deterioration in stability of a slurry.

(E) pH Regulator

Optionally, the slurry composition may further include one or more components, such as a pH regulator, an adjusting agent and a buffering agent, which consist in maintaining the pH of the composition within a desired range. A suitable pH regulator, adjusting agent, or buffering agent includes, for example, sodium hydroxide, potassium hydroxide, ammonium hydroxide, sodium carbonate, potassium carbonate, sulfuric acid, hydrochloric acid, nitric acid, phosphoric acid, citric acid, potassium phosphate, and mixtures thereof.

In one embodiment, the CMP slurry composition according to the present invention may have a pH of 6 to 8. Within this range, the CMP slurry composition can prevent corrosion of metal.

The pH regulator may be present in an amount of 0.001 wt % to 5 wt % in the CMP slurry composition.

MODE FOR INVENTION

Next, examples of the present invention will be described in detail along with comparative examples. However, it should be understood that the following examples are provided by way of illustration only and are not to be construed in any way as limiting the present invention. In addition, a CMP polishing method, which is desirable in planarizing a phase-change material, is provided through the following examples.

EXAMPLE

Examples 1 to 5 and Comparative Examples 1 to 4

Colloidal silica, a benzotriazole derivative (1,2,3-triazole), hydrogen peroxide, and a complexing agent were mixed with deionized water in amounts as listed Table 1. Next, an overall slurry composition was adjusted to a pH of 7.0 using potassium hydroxide, thereby preparing CMP slurry compositions. Next, polishing evaluation was performed by the following method.

Details of Each Component Used in Examples and Comparative Examples (A) Colloidal Silica (a1) Spherical type colloidal silica (PL-3L, Fuso Co., Ltd.) having an average specific surface area of 81.2 $m^2$/g to 83.2 $m^2$/g and a diameter of 30 nm to 35 nm was used.

(a2) Cocoon type colloidal silica (PL-3, Fuso Co., Ltd.) having an average specific surface area of 78.9 $m^2$/g to 80.9 $m^2$/g, a major diameter of 50 nm to 55 nm and a minor diameter of 25 nm to 30 nm was used.

(a3) Cocoon type colloidal silica (PL-7, Fuso Co., Ltd.) having an average specific surface area of 35.0 $m^2$/g to 40.0 $m^2$/g, a major diameter of 65 nm to 75 nm and a minor diameter of 30 nm to 35 nm was used.

(B) Oxidant

Hydrogen peroxide was used.

(C) Complexing Agent

Glycine was used.

(D) Corrosion Inhibitor 1,2,3-triazole was used.

(E) pH Regulator

Potassium hydroxide was used.

(F) Ultrapure Water

Ultrapure water was used.

Evaluation of Properties

Average Specific Surface Area:

An average value of specific surface area was measured using a specific surface area analyzer (Tristar, Micromeritics Co., Ltd.).

Polishing rate (RR): Polishing was performed for 60 seconds under the following conditions, followed by measuring an amount of removed copper using a resistance meter (CMT-2000N, AIT Co., Ltd.).

Polishing machine: 300 mm Reflexion (Applied Materials Co., Ltd.)

Polishing conditions:

Pad type: CUP4410 (DOW Co., Ltd.)

Platen speed: 98 rpm

Head speed: 87 rpm
Pressure: 2.65 psi
Slurry flow: 250 ml/min
Polishing object: Copper-deposited 12-inch wafer
Defect:
Measurement was performed using a surface defect analyzer (LS-6800, Hitachi Co., Ltd.) (Cu blanket wafer).
Dishing:
Measurement was performed using a surface roughness analyzer (XE-300, Park sys Co., Ltd.) (100 μm width Cu line).

TABLE 1

|     |      | Example |        |        |        |        | Comparative Example |        |        |        |
|-----|------|---------|--------|--------|--------|--------|---------------------|--------|--------|--------|
|     |      | 1       | 2      | 3      | 4      | 5      | 1                   | 2      | 3      | 4      |
| (A) | (a1) | —       | 0.1    | 0.03   | 0.05   | 0.07   | —                   | —      | 0.05   | 7.5    |
|     | (a2) | 0.1     | —      | 0.07   | 0.05   | 0.03   | —                   | 0.05   | —      | 7.5    |
|     | (a3) | —       | —      | —      | —      | —      | 0.1                 | 0.05   | 0.05   | —      |
| (B) |      | 1.0     | 1.0    | 1.0    | 1.0    | 1.0    | 1.0                 | 1.0    | 1.0    | 1.0    |
| (C) |      | 0.6     | 0.6    | 0.6    | 0.6    | 0.6    | 0.6                 | 0.6    | 0.6    | 0.6    |
| (D) |      | 0.01    | 0.01   | 0.01   | 0.01   | 0.01   | 0.01                | 0.01   | 0.01   | 0.01   |
| (E) |      | 0.002   | 0.002  | 0.002  | 0.002  | 0.002  | 0.002               | 0.002  | 0.002  | 0.002  |
| (F) |      | 98.288  | 98.288 | 98.288 | 98.288 | 98.288 | 98.288              | 98.288 | 98.288 | 83.388 |
| RR (Å/min) | | 6454 | 7124 | 7568 | 7768 | 7784 | 7345 | 8145 | 8076 | 33746 |
| Defect (ea) | | 587 | 847 | 614 | 634 | 761 | 877 | 874 | 914 | 2598 |
| Dishing (Å) | | 660 | 820 | 690 | 710 | 765 | 865 | 835 | 875 | 2175 |

(unit: wt %)

It could be confirmed that the CMP slurry compositions of Examples 1 to 5 including colloidal silica according to the present invention had excellent polishing rate and provided less polishing defect and low dishing.

Conversely, it could be confirmed that the CMP slurry compositions of Comparative Examples 1 to 4 provided a large number of polishing defects and high dishing.

It should be understood that that various modifications, changes, alterations, and equivalent embodiments can be made by those skilled in the art without departing from the spirit and scope of the invention.

The invention claimed is:

1. A CMP slurry composition for polishing copper interconnects, comprising:
   0.1 wt % to 2 wt % of colloidal silica;
   0.1 wt % to 30 wt % of an oxidant;
   0.01 wt % to 5 wt % of a complexing agent;
   0.005 wt % to 5 wt % of a corrosion inhibitor;
   0.001 wt % to 5 wt % of a pH regulator, the CMP slurry composition having a pH of 6 to 8; and
   ultrapure water,
   wherein:
   the colloidal silica includes a first colloidal silica having a specific surface area of 81.2 m$^2$/g to 83.2 m$^2$/g and a second colloidal silica having a specific surface area of 78.9 m$^2$/g to 80.9 m$^2$/g,
   the first colloidal silica is spherical colloidal silica and the second colloidal silica is cocoon colloidal silica,
   the first colloidal silica and the second colloidal silica are present in a weight ratio of 1:0.42 to 1:2.34,
   the spherical colloidal silica has an average particle diameter (D50) of 30 nm to 35 nm, and
   the cocoon colloidal silica has a major diameter of 50 nm to 55 nm and a minor diameter of 25 nm to 30 nm.

2. The CMP slurry composition as claimed in claim 1, wherein the oxidant includes one or more of an inorganic per-compound, an organic per-compound, bromic acid, a bromate, nitric acid, a nitrate, chloric acid, a chlorate, chromic acid, a chromate, iodic acid, an iodate, iron, an iron salt, copper, a copper salt, a rare-earth metal oxide, a transition metal oxide, potassium ferricyanide, or potassium dichromate.

3. The CMP slurry composition as claimed in claim 1, wherein the complexing agent includes one or more of a carbonyl compound, a salt of a carbonyl compound, a carboxylic acid compound, a salt of a carboxylic acid compound, an alcohol, or an amine-containing compound.

4. The CMP slurry composition as claimed in claim 1, wherein the corrosion inhibitor includes one or more of benzotriazole, methylbenzotriazole, 1,2,3-triazole, a triazole derivative, a benzotriazole derivative, or a methylbenzotriazole derivative.

5. A method of polishing a copper interconnect, the method comprising:
   polishing the copper interconnect using a CMP slurry composition for polishing copper interconnects, the CMP slurring composition including:
   0.1 wt % to 2 wt % of colloidal silica;
   0.1 wt % to 30 wt % of an oxidant;
   0.01 wt % to 5 wt % of a complexing agent;
   0.005 wt % to 5 wt % of a corrosion inhibitor;
   0.001 wt % to 5 wt % of a pH regulator, the CMP slurry composition having a pH of 6 to 8; and
   ultrapure water,
   wherein:
   the colloidal silica includes a first colloidal silica having a specific surface area of 81.2 m$^2$/g to 83.2 m$^2$/g and a second colloidal silica having a specific surface area of 78.9 m$^2$/g to 80.9 m$^2$/g,
   the first colloidal silica is spherical colloidal silica and second colloidal silica is cocoon colloidal silica,
   the first colloidal silica and the second colloidal silica are present in a weight ratio of 1:0.42 to 1:2.34,
   the spherical colloidal silica has an average particle diameter (D50) of 30 nm to 35 nm, and
   the cocoon colloidal silica has a major diameter of 50 nm to 55 nm and a minor diameter of 25 nm to 30 nm.

6. The method as claimed in claim 5, wherein the colloidal silica is present in the CMP slurry composition in an amount of 0.1 wt % to less than 0.5 wt %.

7. The method as claimed in claim 5, wherein the oxidant includes one or more of an inorganic per-compound, an organic per-compound, bromic acid, a bromate, nitric acid, a nitrate, chloric acid, a chlorate, chromic acid, a chromate, iodic acid, an iodate, iron, an iron salt, copper, a copper salt, a rare-earth metal oxide, a transition metal oxide, potassium ferricyanide, or potassium dichromate.

8. The method as claimed in claim 5, wherein the complexing agent includes one or more of a carbonyl compound, a salt of a carbonyl compound, a carboxylic acid compound, a salt of a carboxylic acid compound, an alcohol, or an amine-containing compound.

9. The method as claimed in claim 5, wherein the corrosion inhibitor includes one or more of benzotriazole, methylbenzotriazole, 1,2,3-triazole, a triazole derivative, a benzotriazole derivative, or a methylbenzotriazole derivative.

\* \* \* \* \*